United States Patent
Zhang et al.

(10) Patent No.: US 12,374,175 B2
(45) Date of Patent: Jul. 29, 2025

(54) DETECTING DEGRADATION WITHIN ELECTRIC MOTORS

(71) Applicant: GM Global Technology Operations LLC, Detroit, MI (US)

(72) Inventors: Jiyu Zhang, Sterling Heights, MI (US); Brian J. Gallert, Lake Orion, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 378 days.

(21) Appl. No.: 17/993,258

(22) Filed: Nov. 23, 2022

(65) Prior Publication Data
US 2024/0169771 A1    May 23, 2024

(51) Int. Cl.
| | | |
|---|---|---|
| *H02P 21/20* | (2016.01) | |
| *G01R 31/34* | (2020.01) | |
| *G07C 5/08* | (2006.01) | |
| *H02P 29/024* | (2016.01) | |
| *H02P 29/66* | (2016.01) | |

(52) U.S. Cl.
CPC ............ *G07C 5/0808* (2013.01); *G01R 31/34* (2013.01); *H02P 21/20* (2016.02); *H02P 29/024* (2013.01); *H02P 29/66* (2016.02)

(58) Field of Classification Search
CPC ...... G07C 5/0808; H02P 21/20; H02P 29/024
See application file for complete search history.

(56) References Cited

U.S. PATENT DOCUMENTS

| | | | | |
|---|---|---|---|---|
| 2011/0241458 A1* | 10/2011 | Rai | ............... | H02K 11/25 318/473 |
| 2015/0022126 A1* | 1/2015 | Schulz | ............ | H02P 29/60 318/400.02 |
| 2021/0175826 A1* | 6/2021 | Zhang | ............ | H02P 21/20 |

FOREIGN PATENT DOCUMENTS

WO    WO-2024068215 A1 *    4/2024    ............ G01M 13/02

* cited by examiner

*Primary Examiner* — Herbert K Roberts
(74) *Attorney, Agent, or Firm* — CANTOR COLBURN LLP

(57) ABSTRACT

Examples described herein provide a computer-implemented method that includes receiving data from an electric motor of a vehicle, the electric motor comprising a stator and a rotor. The method further includes performing a motor health degradation analysis to determine whether a degradation of the electric motor has occurred. The method further includes performing a stator health degradation analysis to determine that a stator degradation has occurred. The method further includes performing a rotor health degradation analysis to determine that a rotor degradation has occurred. The method further includes implementing a corrective action for the vehicle e responsive to determining that the degradation of the electric motor has occurred and at least one of the stator degradation or the rotor degradation has occurred.

20 Claims, 6 Drawing Sheets

DETECTING DEGRADATION WITHIN ELECTRIC MOTORS

INTRODUCTION

Embodiments described herein generally relate to electric motors, and more specifically, to detecting degradation within electric motors.

Modern vehicles (e.g., a car, a motorcycle, a boat, or any other type of automobile) may be equipped with one or more electric motors, such as to drive a wheel(s) of the vehicle. For example, an electric motor can be mechanically coupled to a wheel of a vehicle to apply rotational force to the wheel, creating a driveline. In some examples, a vehicle can include multiple electric motors. The electric motor(s) receives electric power from a rechargeable energy storage system (RESS), which can include one or more batteries for storing electric power. The batteries can be recharged, for example, using a charging station. The RESS can also provide electric power to other systems of the vehicle (e.g., climate control systems, infotainment systems, etc.).

SUMMARY

In one exemplary embodiment, a method is provided. The method includes receiving data from an electric motor of a vehicle, the electric motor comprising a stator and a rotor. The method further includes performing a motor health degradation analysis to determine whether a degradation of the electric motor has occurred. The method further includes performing a stator health degradation analysis to determine that a stator degradation has occurred. The method further includes performing a rotor health degradation analysis to determine that a rotor degradation has occurred. The method further includes implementing a corrective action for the vehicle e responsive to determining that the degradation of the electric motor has occurred and at least one of the stator degradation or the rotor degradation has occurred.

In addition to one or more of the features described herein, or as an alternative, further embodiments of the method may include that the motor health degradation analysis is based at least in part on a torque error of the electric motor.

In addition to one or more of the features described herein, or as an alternative, further embodiments of the method may include that the torque error of the electric motor is based at least in part on a calculated motor torque and an estimated motor torque.

In addition to one or more of the features described herein, or as an alternative, further embodiments of the method may include that the calculated motor torque is based at least in part on a current through a d-axis of the electric motor, a current through a q-axis of the electric motor, an estimated flux of the stator through the d-axis of the electric motor, and an estimated flux of the stator through the q-axis of the electric motor.

In addition to one or more of the features described herein, or as an alternative, further embodiments of the method may include that the estimated motor torque is based at least in part on an input direct current power into an inverter associated with the electric motor.

In addition to one or more of the features described herein, or as an alternative, further embodiments of the method may include that the stator health degradation analysis is based at least in part on a temperature of the stator and a temperature of a coolant of the electric motor.

In addition to one or more of the features described herein, or as an alternative, further embodiments of the method may include that the rotor health degradation analysis based at least in part on a current through the electric motor and a magnetic flux through the electric motor or based at least in part on a ratio of measured or estimated d-axis current to a d-axis knee current.

In another exemplary embodiment a controller is provided. The controller includes a memory having computer readable instructions and a processing device for executing the computer readable instructions. The computer readable instructions control the processing device to perform operations. The operations include receiving data from an electric motor of a vehicle, the electric motor comprising a stator and a rotor. The operations further include performing a motor health degradation analysis to determine whether a degradation of the electric motor has occurred. The operations further include performing a stator health degradation analysis to determine that a stator degradation has occurred. The operations further include performing a rotor health degradation analysis to determine that a rotor degradation has occurred. The operations further include implementing a corrective action for the vehicle responsive to determining that the degradation of the electric motor has occurred and at least one of the stator degradation or the rotor degradation has occurred.

In addition to one or more of the features described herein, or as an alternative, further embodiments of the controller may include that the motor health degradation analysis is based at least in part on a torque error of the electric motor.

In addition to one or more of the features described herein, or as an alternative, further embodiments of the controller may include that the torque error of the electric motor is based at least in part on a calculated motor torque and an estimated motor torque.

In addition to one or more of the features described herein, or as an alternative, further embodiments of the controller may include that the calculated motor torque is based at least in part on a current through a d-axis of the electric motor, a current through a q-axis of the electric motor, an estimated flux of the stator through the d-axis of the electric motor, and an estimated flux of the stator through the q-axis of the electric motor.

In addition to one or more of the features described herein, or as an alternative, further embodiments of the controller may include that the estimated motor torque is based at least in part on an input direct current power into an inverter associated with the electric motor.

In addition to one or more of the features described herein, or as an alternative, further embodiments of the controller may include that the stator health degradation analysis is based at least in part on a temperature of the stator and a temperature of a coolant of the electric motor.

In addition to one or more of the features described herein, or as an alternative, further embodiments of the controller may include that the rotor health degradation analysis based at least in part on a current through the electric motor and a magnetic flux through the electric motor or based at least in part on a ratio of measured or estimated d-axis current to a d-axis knee current.

In another exemplary embodiment a vehicle includes an electric motor and a controller. The controller receives data from the electric motor of the vehicle, the electric motor comprising a stator and a rotor. The controller further performs a motor health degradation analysis to determine whether a degradation of the electric motor has occurred.

The controller further performs a stator health degradation analysis to determine that a stator degradation has occurred. The controller further performs a rotor health degradation analysis to determine that a stator degradation has occurred. The controller further implements a corrective action for the vehicle responsive to determining that the degradation of the electric motor has occurred and at least one of the rotor degradation or the rotor degradation has occurred.

In addition to one or more of the features described herein, or as an alternative, further embodiments of the vehicle may include that the motor health degradation analysis is based at least in part on a torque error of the electric motor.

In addition to one or more of the features described herein, or as an alternative, further embodiments of the vehicle may include that the torque error of the electric motor is based at least in part on a calculated motor torque and an estimated motor torque.

In addition to one or more of the features described herein, or as an alternative, further embodiments of the vehicle may include that the calculated motor torque is based at least in part on a current through a d-axis of the electric motor, a current through a q-axis of the electric motor, an estimated flux of the stator through the d-axis of the electric motor, and an estimated flux of the stator through the q-axis of the electric motor.

In addition to one or more of the features described herein, or as an alternative, further embodiments of the vehicle may include that the estimated motor torque is based at least in part on an input direct current power into an inverter associated with the electric motor.

In addition to one or more of the features described herein, or as an alternative, further embodiments of the vehicle may include that the stator health degradation analysis is based at least in part on a temperature of the stator and a temperature of a coolant of the electric motor, and wherein the rotor health degradation analysis based at least in part on a current through the electric motor and a magnetic flux through the electric motor.

The above features and advantages, and other features and advantages, of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
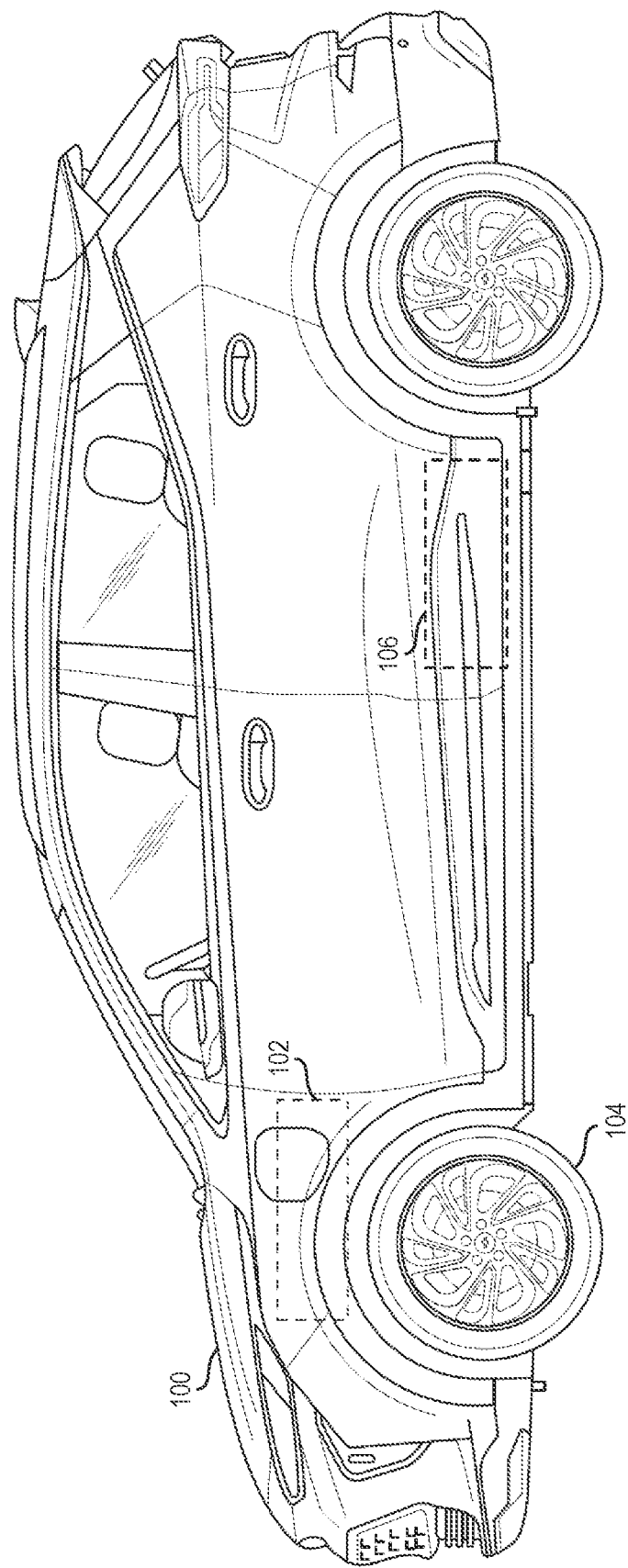
FIG. 1 shows a schematic illustration of a vehicle according to one or more embodiments described herein.

The following description is merely exemplary in nature and is not intended to limit the present disclosure, its application or uses. It should be understood that throughout the drawings, corresponding reference numerals indicate like or corresponding parts and features.

FIG. 1 shows a vehicle 100 according to one or more embodiments described herein. The vehicle 100 can be a car, a truck, a van, a bus, a motorcycle, a boat, or any other type of automobile. According to an embodiment, the vehicle 100 includes an internal combustion engine fueled by gasoline, diesel, or the like. According to another embodiment, the vehicle 100 is a hybrid electric vehicle partially or wholly powered by electrical power. According to another embodiment, the vehicle 100 is an electric vehicle powered by electrical power. In the example of FIG. 1, the vehicle 100 is an electric vehicle (or hybrid electric vehicle) and includes an electric motor 102. The electric motor 102 can be mechanically coupled to a wheel 104 of the vehicle 100 to apply rotational force to the wheel 104, creating a driveline. In some examples, a vehicle 100 can include multiple electric motors. The electric motor 102 receives electric power from a rechargeable energy storage system (RESS) 106, which can include one or more batteries for storing electric power. The batteries can be recharged, for example, using a charging station. The RESS 106 can also provide electric power to other systems of the vehicle (e.g., climate control systems, infotainment systems, etc.) (not shown). According to an embodiment, the electric motor 102 can include a stator and a rotor that rotates relative to the stator. Together, the stator and rotor convert electrical power to mechanical power.

One or more embodiments described herein provide for detecting degradation within electric motors used in automotive applications (e.g., for a vehicle). According to one or more embodiments, detecting degradation is based on calculating a set of motor stator and rotor health indicators ("health indicators") and to predict electric motor failures by continuously monitoring the health indicators. One or more embodiments described herein can be used to detect and isolate degradation in a stator and/or a rotor of an electric motor. More specifically, for permanent magnetic synchronous machines, one or more embodiments described herein can detect and isolate rotor demagnetization faults.

One example of a health indicator is a torque error. Torque error is the difference between an estimated motor torque (based on electric motor speed and power) and a calculated torque (from motor currents and magnetic fluxes). Torque error can be used to detect motor abnormality.

Another example of a health indicator is a temperature difference between a measured or estimated stator temperature and a temperature of a drive unit fluid. The temperature difference can be used to detect motor abnormality relating to a stator.

Another example of a health indicator is a rotor demagnetization state of health (SOH) figure of merits (FOMs), which can be used to detect motor abnormality relating to a rotor.

Another example of a health indicator is estimated rotor magnetic strength.

One or more embodiments described herein can be used for early detection of motor degradation using trend analysis of the motor health indicators. For example, by calculating a difference between a value for a current health indicator(s) with respect to a baseline value for a respective baseline health indicator(s). This can be performed on a per-vehicle basis, for example.

One or more embodiments described herein provides for comparing the difference between the values for the current health indictor(s) with respect to the baseline value to a threshold. Once the threshold has been satisfied (e.g., met, exceeded, or the like), such as for a certain period of time (e.g., 1 second, 5 minutes, etc.), a prognostic decision is made to determine that the motor has degraded.

One or more embodiments described herein includes design of a set of thresholds to capture motor fault at an early stage, which can then be used to alert customers prior to failure. This prevents sudden loss of propulsion and walk-home situations.

Figure 2:
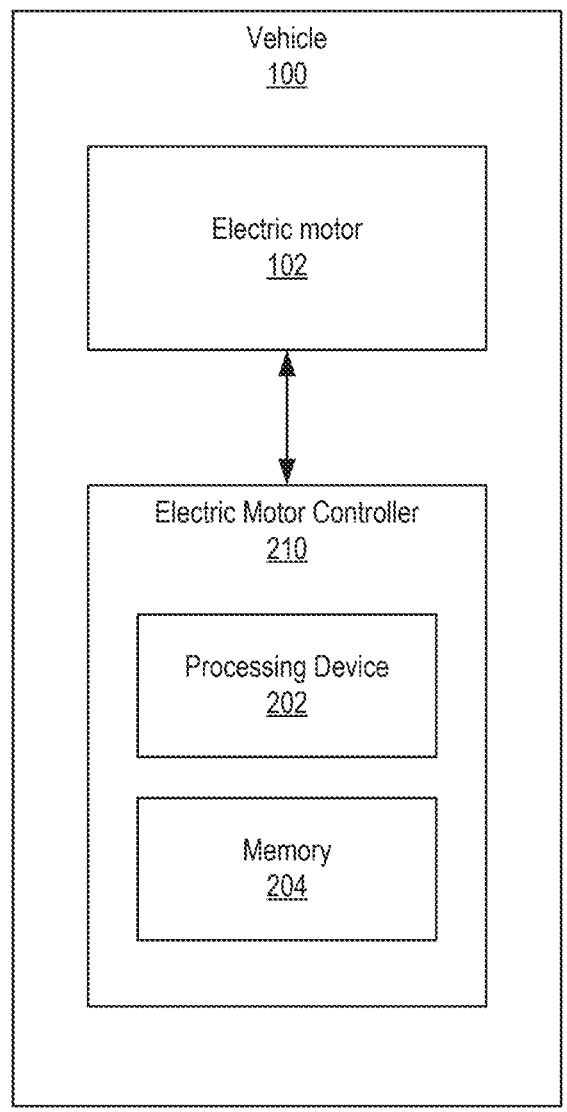
FIG. 2 shows a block diagram of the vehicle of FIG. 1 according to one or more embodiments described herein.

FIG. 2 is a block diagram of the vehicle 100 according to one or more embodiments described herein. The vehicle 100 includes the electric motor 102 that applies rotational force to the wheel 104 and is powered by the RESS 106. The vehicle 100 also includes an electric motor controller 210 (e.g., also referred to as a "controller" or "processing system"), which is communicatively connected to the electric motor 102 such that the electric motor 102 and the electric motor controller 210 can exchange (e.g., transmit and/or receive) data, messages, commands, information, and/or the like, including combinations and/or multiples thereof. It is understood that one or more embodiments described herein is capable of being implemented in conjunction with any other type of computing environment now known or later developed. The electric motor controller 210 can include a processing device 202, which may be one or more processing units. In aspects of the present disclosure, each processing unit can include a reduced instruction set computer (RISC) microprocessor. As another example, the processing device 202 can be a special-purpose processing device, such as application specific hardware, application specific integrated circuits (ASICs), application specific special processors (ASSPs), field programmable gate arrays (FPGAs), embedded controllers, hardwired circuitry, and/or the like, including combinations and/or multiples thereof. The processing device 202 can be coupled to memory 204, which can be any suitable type of memory device for storing data temporarily (e.g., random access memory (RAM)) and/or persistently (e.g., read only memory (ROM)). According to aspects of the present disclosure, the residual overcurrent protection described herein can be implemented using a combination of hardware and programming. The programming can be processor executable instructions stored on a tangible memory, and the hardware can include the processing device 202 for executing those instructions. Thus a system memory (e.g., memory 204) can store program instructions that when executed by the processing device 202 detect degradation within the electric motor 102 as described herein.

Figure 3A:
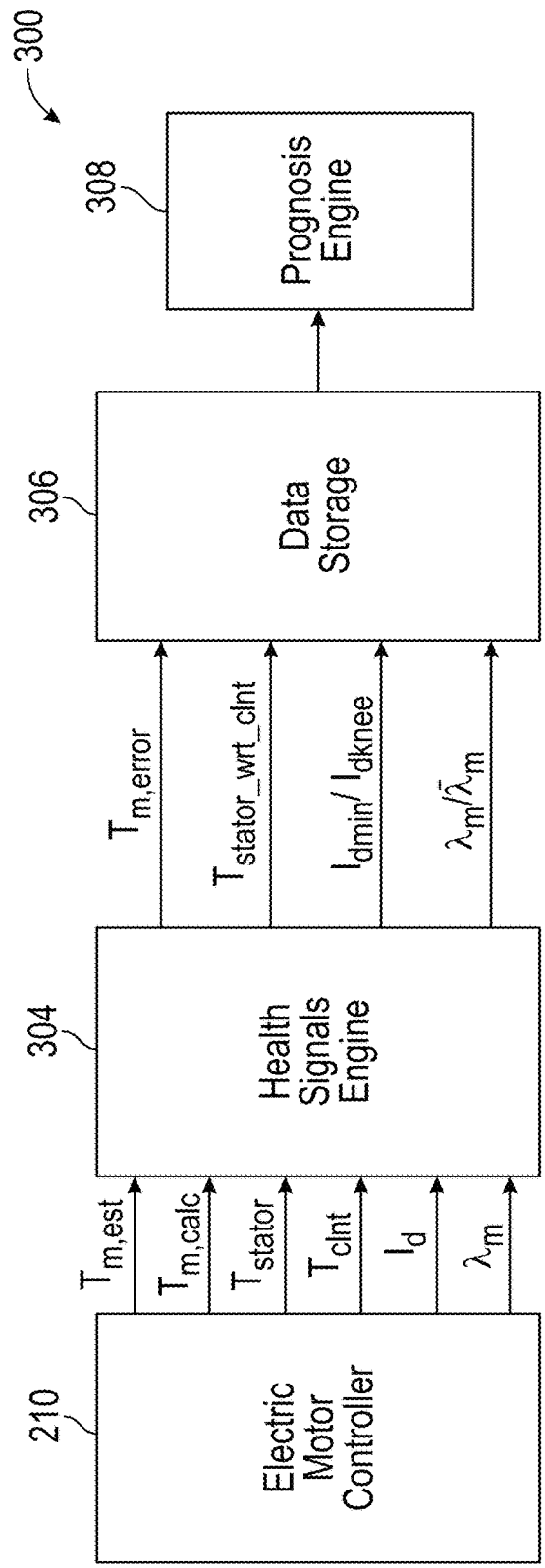
FIG. 3A shows a block diagram of a system for detecting degradation within electric motors according to one or more embodiments described herein.

FIG. 3A shows a block diagram of a system 300 for detecting degradation within electric motors according to one or more embodiments described herein. In this example, the system 300 includes the electric motor controller 210, which outputs one or more of the following values relating to the electric motor 102: an estimated motor torque ($T_{m,est}$) of the electric motor 102, a calculated motor torque ($T_{m,calc}$) of the electric motor 102, a temperature of a stator ($T_{stator}$) of the electric motor 102, a temperature of a coolant ($T_{clnt}$) of the electric motor 102, a current of the stator through a d-axis ($I_d$) of the electric motor 102, and a magnetic flux developed by the rotor magnets ($\lambda_m$) of the electric motor 102. The values output by the electric motor controller 210 are input into a health signals engine 304, which may be embodied in the electric motor controller 210 and/or in another controller and/or system.

The health signals engine 304 determines motor health indicators, such as rotor and/or stator health indicators. The health signals engine 304 generates and outputs one or more of the following values: a torque error ($T_{m,error}$) of the electric motor 102, a temperature of the stator with respect to the coolant temperature ($T_{stator\_wrt\_clnt}$) of the electric motor 102, a ratio between a minimum current (captured throughout a trip, for example) and a knee current through the d-axis ($I_{dmin}/I_{dknee}$) of the electric motor 102, and a ratio of magnetic flux relative to a nominal flux ($\lambda_m/\bar{\lambda}_m$) of the electric motor 102.

One or more stator health indicators are now described. The temperature of the stator with respect to the coolant temperature ($T_{stator\_wrt\_clnt}$) of the electric motor 102 is an indicator of stator health and can be calculated as the error (difference) between the measured or estimated stator temperature and the coolant (drive unit fluid) temperature. The stator and rotor temperatures can be estimated based on coolant temperature and a motor thermal model according to one or more embodiments described herein. The motor thermal model is based on motor power losses (stator and rotor iron loss and coper loss), heat transfer coefficients, which are based on coolant temperature and flow rates, and thermal capacitance. The power losses are based on motor speed, motor currents through the q-axis ($I_q$) and d-axis ($I_d$) and DC voltage.

One or more rotor health indicators are now described. Rotor demagnetization state of health (SOH) figure of merit (FOM) can be an indicator of rotor health. This indicator tracks how close the ratio of d-axis current to the d-axis knee current is to 1, where exceeding 1 indicates the start of demagnetization. The rotor demagnetization status can be determined based on the minimum d-axis current ($I_d$) that a drive cycle encountered as follows:

$$DeMag\ SOH = \frac{I_{dMin}}{I_{dKnee}}$$

where $I_{dKnee}$ is calculated using estimated rotor temperature, which is the threshold value of the d-axis current in determining whether the demagnetization has occurred. A low confidence state of health is determined using the maximum system current ($I_s$), if the minimum d-axis current is not accurate because the resolver has some issue or the rotor temperature is believed to be inaccurate, and/or the like.

According to one or more embodiments described herein, estimated rotor magnetic strength is another motor health indicator. A flux observer is more accurate at higher speeds of the electric motor 102 according to one or more embodiments described herein. A torque achieved approach more accurate at lower speeds of the electric motor 102 according to one or more embodiments described herein. The health signals engine 304 can use one or more of the flux observer or the torque achieved approach to determine magnetic flux for the electric motor 102 as described herein.

Figure 3B:
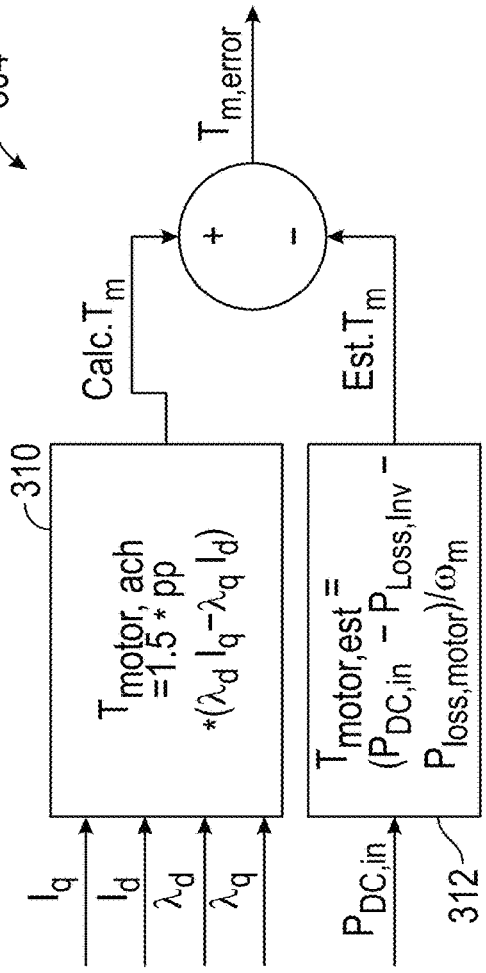
FIG. 3B shows a block diagram of the health signals engine of the system 300 according to one or more embodiments described herein.

Turning now to FIG. 3B, the health signals engine 304 is shown in more detail regarding generating the torque error ($T_{m,error}$) of the electric motor 102 according to one or more embodiments described herein. The health signals engine 304 receives, at block 310, a current through the q-axis ($I_q$)

of the electric motor 102, a current through the d-axis ($I_d$) of the electric motor 102, an estimated flux of the stator through the d-axis ($\lambda_d$) of the electric motor 102, and an estimated flux of the stator through the q-axis ($\lambda_q$) of the electric motor 102. Using these values, the block 310 of the health signals engine 304 calculates a calculated motor torque of the electric motor 102 ($CalcT_m$) as 1.5*(the flux of pole pairs of the electric motor 102)*($\lambda_d I_q - \lambda_q I_d$) according to one or more embodiments described herein.

At block 312, the health signals engine 304 determines an estimated motor torque of the electric motor 102 ($Est.T_m$) using a received input DC power into an inverter ($P_{DC,in}$) of the electric motor 102. The input DC power into an inverter ($P_{DC,in}$) can be determined based on a DC current (estimate or measured) and a DC voltage measured at input). The block 312 of the health signals engine 304 estimates the estimated torque of the electric motor 102 ($Est.T_m$) as ((the input DC power into an inverter ($P_{DC,in}$))–(a power loss from the inverter ($P_{loss,inv}$))–(a power loss from the electric motor 102 ($P_{loss,m}$))/(a speed of the electric motor 102 ($\omega_m$)).

The torque error ($T_{m,error}$) of the electric motor 102 is then calculated based on the calculated motor torque of the electric motor 102 ($CalcT_m$) and the estimated motor torque of the electric motor 102 ($Est.T_m$) as shown. For example, the torque error ($T_{m,error}$) is calculated as the calculated motor torque of the electric motor 102 ($CalcT_m$)–the estimated motor torque of the electric motor 102 ($Est.T_m$).

With continued reference to FIG. 3A, the outputs of the health signals engine 304 are saved at a data storage device 306. The data storage device 306 can be a local (e.g., onboard the vehicle 100) persistent or non-persistent memory or storage device and/or a remote storage device, such as a cloud storage device and/or a remote processing system.

According to one or more embodiments described herein, the system 300 also includes a prognosis engine 308, which can be integral to or separate from the electric motor controller 210. The prognosis engine 308 detects trends within the electric motor 102 for prediction of electric motor failures due to motor faults.

Figure 4:
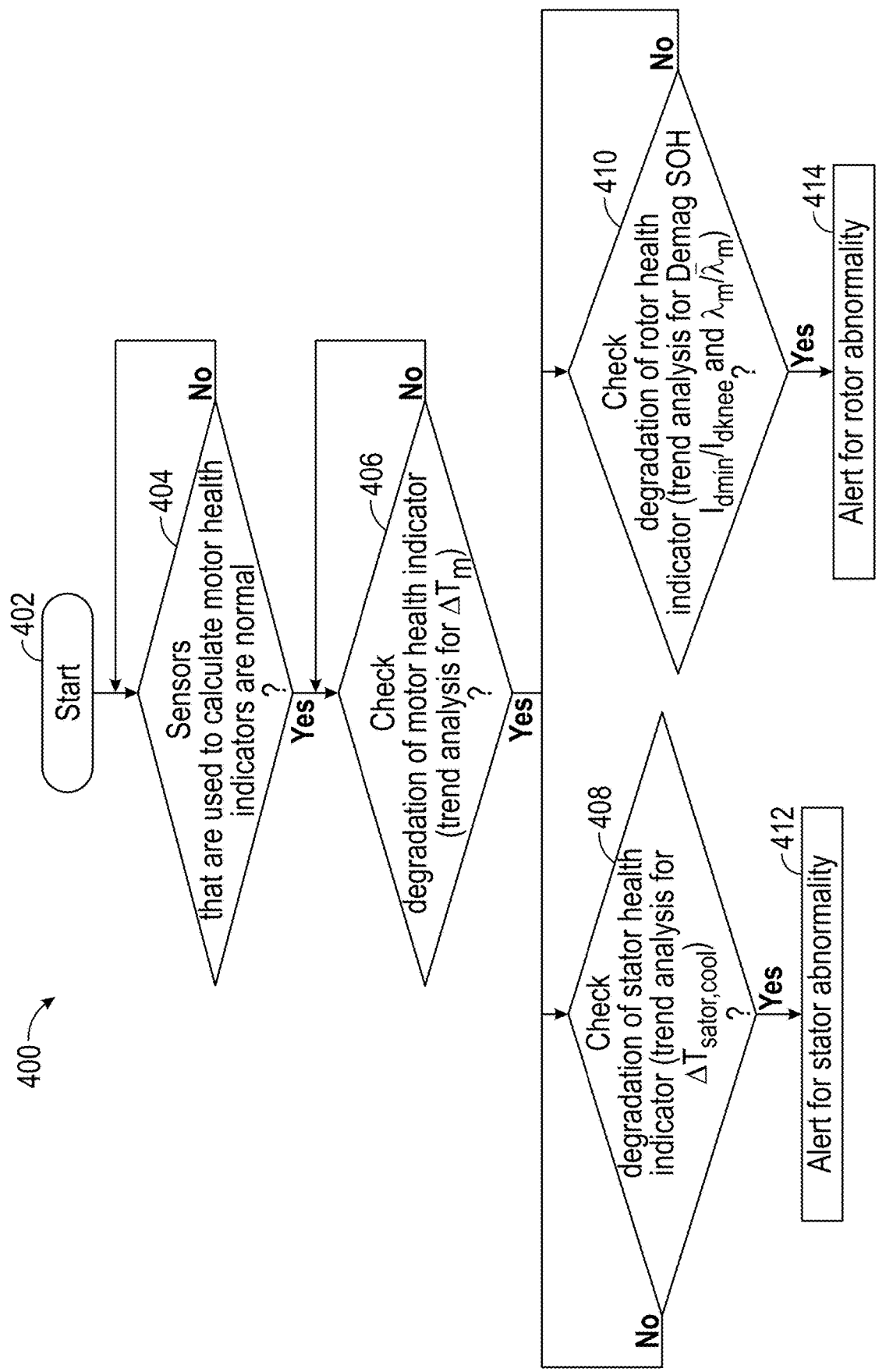
FIG. 4 shows a flow diagram of a method for motor prognosis according to one or more embodiments described herein.

FIG. 4 shows a flow diagram of a method 400 for motor prognosis according to one or more embodiments described herein. The method 400 can be performed by any suitable system, controller, or device, for example, by the electric motor controller 210, by the system 300, and/or the like, including combinations and/or multiples thereof.

The method 400 starts at block 402 and continues to block 404, where it is determined whether sensors that are used to calculate motor health indicators are detecting normal readings. If not, the method 400 repeats. Otherwise, the method 400 proceeds to block 406, where it is determined whether degradation of the electric motor 102 has occurred based on the motor health indicators (e.g., a change in motor torque ($T_m$) indicates degradation). If not, the method repeats block 406. If so, the method proceeds to blocks 408 and 410 as shown.

At block 408, the method 400 checks degradation of stator health indicators as described herein. This can be trend analysis for the change in the temperature of the stator with respect to the coolant, for example. This process (block 408) can be repeated if no degradation is found. However, if stator degradation is indicated, the method 400 proceeds to block 412 where a corrective action is taken (e.g., cause the vehicle to navigate to a safe location) and/or an alert is issued indicating the stator abnormality.

At block 410, the method 400 checks degradation of rotor health indicators as described herein. This can be trend analysis for demagnetization state of health, for example. This process (block 410) can be repeated if no degradation is found. However, if rotor degradation is indicated, the method 400 proceeds to block 414 where a corrective action is taken (e.g., cause the vehicle to navigate to a safe location) and/or an alert is issued indicating the rotor abnormality.

Additional processes also may be included, and it should be understood that the process depicted in FIG. 4 represents an illustration, and that other processes may be added or existing processes may be removed, modified, or rearranged without departing from the scope of the present disclosure.

Figure 5:
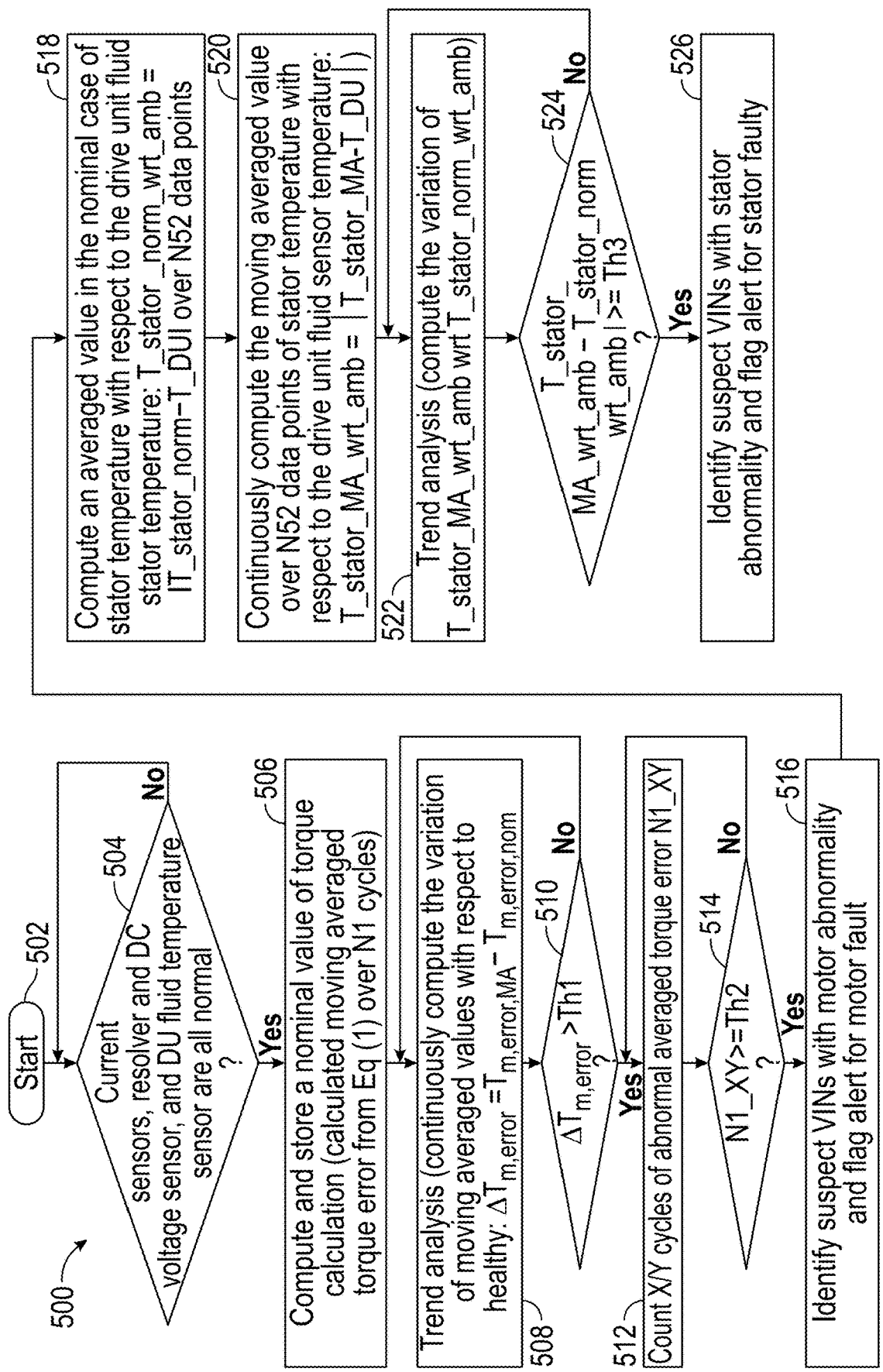
FIG. 5 shows a flow diagram of a method for fault isolation and prognosis for a motor stator according to one or more embodiments described herein.

FIG. 5 shows a flow diagram of a method 500 for fault isolation and prognosis for a motor stator according to one or more embodiments described herein. The method 500 can be performed by any suitable system, controller, or device, for example, by the electric motor controller 210, by the system 300, and/or the like, including combinations and/or multiples thereof.

An example of a motor health degradation analysis is then performed at blocks 502-516. At block 502, the method 500 begins and continues to block 504, where it is determined whether current sensors, resolver and DC voltage sensors, and drive unit (e.g., the electric motor 102) fluid temperature sensors are functioning normally. If not, the block 504 repeats. If so, the method 500 continues to block 506 where a moving averaged torque error is calculated and stored. At block 508, a trend analysis is performed (e.g., continuously compute a variation of the moving average values with respect to health (e.g., $T_{m,error}$). At block 510, it is determined whether $T_{m,error}$ is greater than a first threshold. If not, the method 500 returns to block 508. If so, at block 512, a number (N1) of cycles of abnormal averaged torque error are counted. At block 514, it is determined whether the number (N1) is greater than a second threshold. If not, the method 500 returns to block 512. If so, at block 516, suspected vehicle identification numbers (VINs) with the motor abnormality are identified and flagged.

An example of a stator health degradation analysis is then performed at blocks 518-526. The method 500 proceeds to block 518, where an average value in the nominal case of stator temperature with respect to the drive unit (coolant) fluid sensor temperature is computed over a number of data points (N52) (e.g., 52 data points for weekly evaluation over a year). At block 520, the moving average value over the number of data points (N52) of the stator temperature with respect to the drive unit (coolant) fluid sensor temperature is computed continuously. At block 522, a trend analysis is performed, such as computing the variation of the temperature from blocks 520 and 518. It is then determined at block 524 whether the difference from block 522 is greater than a third threshold. If not, the method 500 returns to block 522. If so, the method proceeds to block 526 and identifies suspected VINs with the stator abnormality are identified and flagged.

Additional processes also may be included, and it should be understood that the process depicted in FIG. 5 represents an illustration, and that other processes may be added or existing processes may be removed, modified, or rearranged without departing from the scope of the present disclosure.

Figure 6:
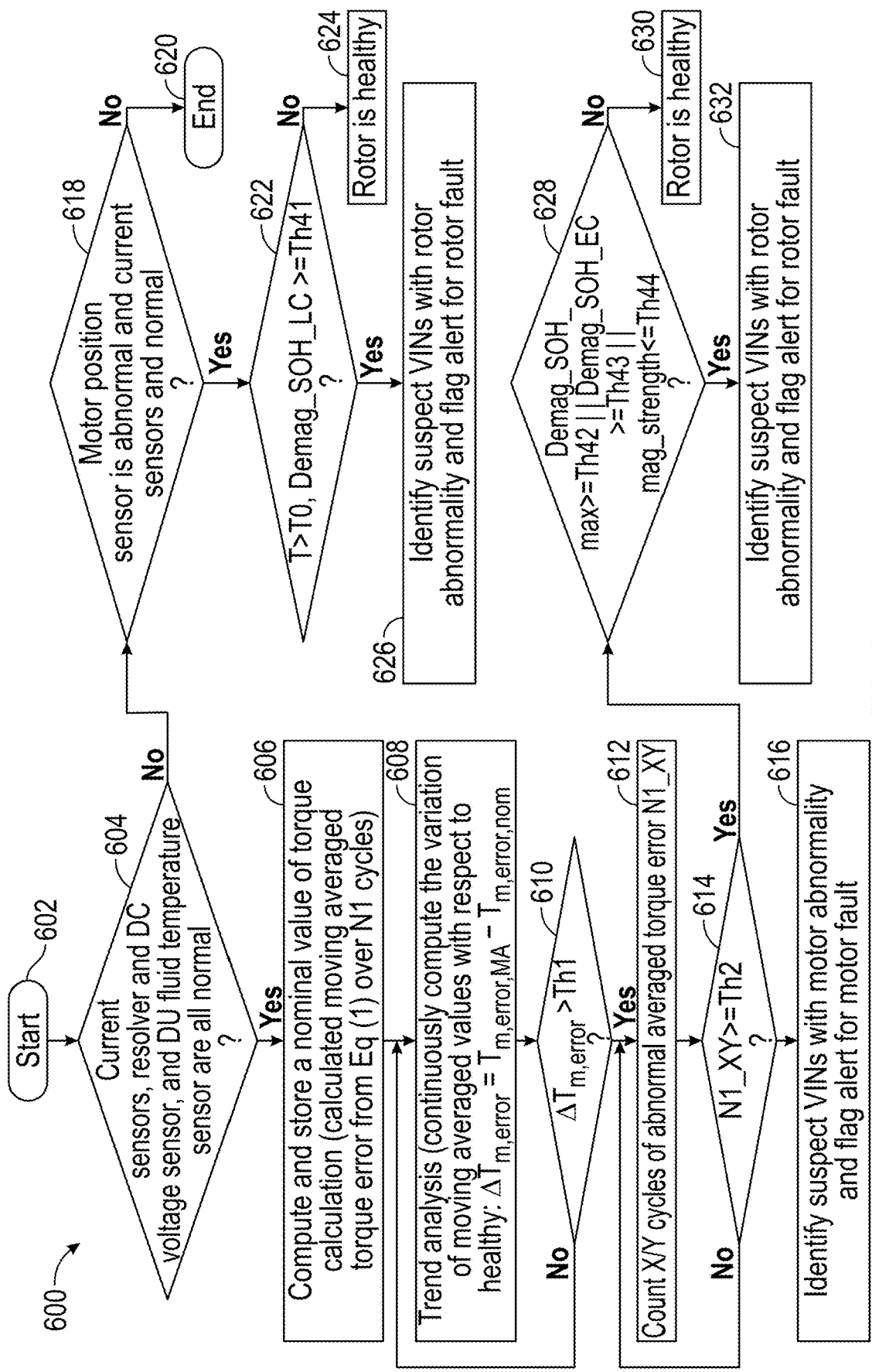
FIG. 6 shows a flow diagram of a method for fault isolation and prognosis for a motor rotor demagnetization according to one or more embodiments described herein.

FIG. 6 shows a flow diagram of a method 600 for fault isolation and prognosis for a motor rotor demagnetization according to one or more embodiments described herein. The method 600 can be performed by any suitable system, controller, or device, for example, by the electric motor controller 210, by the system 300, and/or the like, including combinations and/or multiples thereof.

An example of a motor health degradation analysis is then performed at blocks 602-616. At block 602, the method 600 begins and proceeds to block 604, where it is determined whether current sensors, resolver and DC voltage sensors, and drive unit (e.g., the electric motor 102) fluid temperature sensors are functioning normally. If not, the method 600 continues to block 618. If so, the method 600 continues to block 606 where a moving averaged torque error is calculated and stored. At block 608, a trend analysis is performed (e.g., continuously compute a variation of the moving average values with respect to health (e.g., $T_{m,error}$). At block 610, it is determined whether $T_{m,error}$ is greater than a first threshold. If not, the method 600 returns to block 608. If so, at block 612, a number (N1) of cycles of abnormal averaged torque error are counted. At block 614, it is determined whether the number (N1) is greater than a second threshold. If not, the method 600 returns to block 612. If so, at block 616, suspected vehicle identification numbers (VINs) with the motor abnormality are identified and flagged and the method proceeds to block 628.

At block 618, it is determined whether the motor position sensor is abnormal and current sensors are normal. If not, the method 600 ends at block 620. If so, at block 622 it is determined whether a demagnetization low confidence state of health is greater than a threshold with respect to temperature (e.g., the state of health is dependent on the temperature and the current). If not, the rotor is healthy as indicated at block 624. However, if so, at block 626, suspected VINs with the rotor abnormality are identified and flagged.

At block 628, it is determined whether the rotor is healthy or not by checking a demagnetization state of health figure of merit (as described herein) and/or by determining whether rotor magnetic strength is within an acceptable range. This provides a high-confidence state of health approach based on measured d-axis current and measured rotor magnet strength. If not, the rotor is healthy as indicated at block 630. However, if so, at block 632, suspected VINs with the rotor abnormality are identified and flagged. Additional processes also may be included, and it should be understood that the process depicted in FIG. 6 represents an illustration, and that other processes may be added or existing processes may be removed, modified, or rearranged without departing from the scope of the present disclosure.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method comprising:
receiving data from an electric motor of a vehicle, the electric motor comprising a stator and a rotor;
performing a motor health degradation analysis to determine whether a degradation of the electric motor has occurred;
performing a stator health degradation analysis to determine that a stator degradation has occurred;
performing a rotor health degradation analysis to determine that a rotor degradation has occurred, wherein the rotor degradation is a rotor demagnetization, wherein a rotor demagnetization status is determined based on a ratio of a minimum d-axis current ($i_{dMin}$) that a drive cycle encountered to a d-axis knee current ($i_{dknee}$), wherein the d-axis knee current ($i_{dknee}$) is estimated using a rotor temperature; and
implementing a corrective action for the vehicle responsive to determining that the degradation of the electric motor has occurred and at least one of the stator degradation or the rotor degradation has occurred.

2. The method of claim 1, wherein the motor health degradation analysis is based at least in part on a torque error of the electric motor.

3. The method of claim 2, wherein the torque error of the electric motor is based at least in part on a calculated motor torque and an estimated motor torque.

4. The method of claim 3, wherein the calculated motor torque is based at least in part on a current through a d-axis of the electric motor, a current through a q-axis of the electric motor, an estimated flux of the stator through the d-axis of the electric motor, and an estimated flux of the stator through the q-axis of the electric motor.

5. The method of claim 3, wherein the estimated motor torque is based at least in part on an input direct current power into an inverter associated with the electric motor.

6. The method of claim 1, wherein the stator health degradation analysis is based at least in part on a temperature of the stator and a temperature of a coolant of the electric motor.

7. The method of claim 1, wherein the rotor health degradation analysis based at least in part on a current through the electric motor and a magnetic flux through the electric motor or based at least in part on a ratio of measured or estimated d-axis current to a d-axis knee current.

8. A controller comprising:
a memory comprising computer readable instructions; and
a processing device for executing the computer readable instructions, the computer readable instructions controlling the processing device to perform operations comprising:

receiving data from an electric motor of a vehicle, the electric motor comprising a stator and a rotor;

performing a motor health degradation analysis to determine whether a degradation of the electric motor has occurred;

performing a stator health degradation analysis to determine that a stator degradation has occurred, wherein the stator health degradation analysis is based at least in part on a temperature of the stator with respect to the coolant temperature;

performing a rotor health degradation analysis to determine that a rotor degradation has occurred, wherein the rotor degradation is a rotor demagnetization, wherein a rotor demagnetization status is determined based on a ratio of a minimum d-axis current ($i_{dMin}$) that a drive cycle encountered to a d-axis knee current ($i_{dknee}$), wherein the d-axis knee current ($i_{dknee}$) is estimated using a rotor temperature; and implementing a corrective action for the vehicle responsive to determining that the degradation of the electric motor has occurred and at least one of the stator degradation or the rotor degradation has occurred.

9. The controller of claim 8, wherein the motor health degradation analysis is based at least in part on a torque error of the electric motor.

10. The controller of claim 9, wherein the torque error of the electric motor is based at least in part on a calculated motor torque and an estimated motor torque.

11. The controller of claim 10, wherein the calculated motor torque is based at least in part on a current through a d-axis of the electric motor, a current through a q-axis of the electric motor, an estimated flux of the stator through the d-axis of the electric motor, and an estimated flux of the stator through the q-axis of the electric motor.

12. The controller of claim 10, wherein the estimated motor torque is based at least in part on an input direct current power into an inverter associated with the electric motor.

13. The controller of claim 8, wherein the stator health degradation analysis is based at least in part on a temperature of the stator and a temperature of a coolant of the electric motor.

14. The controller of claim 8, wherein the rotor health degradation analysis based at least in part on a current through the electric motor and a magnetic flux through the electric motor or based at least in part on a ratio of measured or estimated d-axis current to a d-axis knee current.

15. A vehicle comprising:
an electric motor; and
a controller to:
   receive data from the electric motor of the vehicle, the electric motor comprising a stator and a rotor;
   perform a motor health degradation analysis to determine whether a degradation of the electric motor has occurred;
   perform a stator health degradation analysis to determine that a stator degradation has occurred, wherein the stator health degradation analysis is based at least in part on a temperature of the stator with respect to the coolant temperature;
   perform a rotor health degradation analysis to determine that a stator-rotor degradation has occurred, wherein the rotor degradation is a rotor demagnetization, wherein a rotor demagnetization status is determined based on a ratio of a minimum d-axis current ($i_{dMin}$) that a drive cycle encountered to a d-axis knee current ($i_{dKnee}$), wherein the d-axis knee current ($i_{dKnee}$) is estimated using a rotor temperature; and
   implement a corrective action for the vehicle responsive to determining that the degradation of the electric motor has occurred and at least one of the rotor-stator degradation or the rotor degradation has occurred.

16. The vehicle of claim 15, wherein the motor health degradation analysis is based at least in part on a torque error of the electric motor.

17. The vehicle of claim 16, wherein the torque error of the electric motor is based at least in part on a calculated motor torque and an estimated motor torque.

18. The vehicle of claim 17, wherein the calculated motor torque is based at least in part on a current through a d-axis of the electric motor, a current through a q-axis of the electric motor, an estimated flux of the stator through the d-axis of the electric motor, and an estimated flux of the stator through the q-axis of the electric motor.

19. The vehicle of claim 17, wherein the estimated motor torque is based at least in part on an input direct current power into an inverter associated with the electric motor.

20. The vehicle of claim 17, wherein the rotor health degradation analysis based at least in part on a current through the electric motor and a magnetic flux through the electric motor.

* * * * *